(12) United States Patent
Ong

(10) Patent No.: US 11,621,027 B2
(45) Date of Patent: Apr. 4, 2023

(54) MRAM ARCHITECTURE WITH MULTIPLEXED SENSE AMPLIFIERS AND DIRECT WRITE THROUGH BUFFERS

(71) Applicant: Integrated Silicon Solution, (Cayman) Inc., Grand Cayman (KY)

(72) Inventor: Adrian E. Ong, Pleasanton, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 17/145,083

(22) Filed: Jan. 8, 2021

(65) Prior Publication Data
US 2021/0217453 A1    Jul. 15, 2021

Related U.S. Application Data

(60) Provisional application No. 62/959,081, filed on Jan. 9, 2020.

(51) Int. Cl.
*G11C 11/16* (2006.01)

(52) U.S. Cl.
CPC ........ *G11C 11/1675* (2013.01); *G11C 11/161* (2013.01); *G11C 11/1655* (2013.01); *G11C 11/1657* (2013.01); *G11C 11/1659* (2013.01); *G11C 11/1673* (2013.01)

(58) Field of Classification Search
CPC .............. G11C 11/1675; G11C 11/161; G11C 11/1655; G11C 11/1657; G11C 11/1659; G11C 11/1673; G11C 11/1653
See application file for complete search history.

(56) References Cited

U.S. PATENT DOCUMENTS

| | | | | |
|---|---|---|---|---|
| 10,236,075 | B1* | 3/2019 | Kim | G11C 11/161 |
| 10,741,255 | B1* | 8/2020 | Huang | G11C 11/1655 |
| 2012/0099390 | A1* | 4/2012 | Cho | G11C 7/1048 365/207 |
| 2014/0355336 | A1* | 12/2014 | Hoya | G11C 11/1659 365/158 |
| 2016/0093384 | A1* | 3/2016 | Lee | G11C 16/24 365/185.12 |
| 2020/0243135 | A1* | 7/2020 | Chou | G11C 5/147 |
| 2020/0335145 | A1* | 10/2020 | Jung | G11C 13/0023 |

* cited by examiner

Primary Examiner — Sultana Begum

(57) ABSTRACT

A magnetic memory device for storing and quickly retrieving data from an array of magnetic memory elements. The array includes a plurality of magnetic memory element such as magnetic tunnel junction elements arranged in rows and columns. A plurality of multiplexed bit lines is connected with a first end of each of the magnetic memory elements and plurality of multiplexed source lines are connected with a second end of each of the magnetic memory elements. The multiplexing allows source line current and/or bit line current to be applied to an individual column of memory elements in the array for quick retrieval of data in a Magnetic Random Access Memory (MRAM) system.

6 Claims, 12 Drawing Sheets

MRAM ARCHITECTURE WITH MULTIPLEXED SENSE AMPLIFIERS AND DIRECT WRITE THROUGH BUFFERS

FIELD OF THE INVENTION

The present invention relates to magnetic random-access memory (MRAM) and more particularly to a magnetic memory array having multiplexed sense amplifiers and direct write through buffers for increased data density.

BACKGROUND

Magnetic Random-Access Memory (MRAM) is a non-volatile data memory technology that stores data using magnetoresistive cells such as Magnetoresistive Tunnel Junction (MTJ) cells. At their most basic level, such MTJ elements include first and second magnetic layers that are separated by a thin, non-magnetic layer such as a tunnel barrier layer, which can be constructed of a material such as Mg—O. The first magnetic layer, which can be referred to as a reference layer, has a magnetization that is fixed in a direction that is perpendicular to that plane of the layer. The second magnetic layer, which can be referred to as a magnetic free layer, has a magnetization that is free to move so that it can be oriented in either of two directions that are both generally perpendicular to the plane of the magnetic free layer. Therefore, the magnetization of the free layer can be either parallel with the magnetization of the reference layer or anti-parallel with the direction of the reference layer (i.e. opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. An electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free and reference layer are oriented in the same direction, the majority spin of the electrons in the free layer is in the same direction as the orientation of the majority spin of the electrons in the reference layer. Because these electron spins are in generally the same direction, the electrons can pass relatively easily through the tunnel barrier layer. However, if the orientations of the magnetizations of the free and reference layers are opposite to one another, the spin of majority electrons in the free layer will be generally opposite to the majority spin of electrons in the reference layer. In this case, electrons cannot easily pass through the barrier layer, resulting in a higher electrical resistance through the MTJ stack.

Because the MTJ element can be switched between low and high electrical resistance states, it can be used as a memory element to store a bit of data. For example, the low resistance state can be read as a "0", whereas the high resistance state can be read as a "1". In addition, because the magnetic orientation of the magnetic free layer remains in its switched orientation without any electrical power to the element, it provides a robust, non-volatile data memory bit.

To write a bit of data to the MTJ cell, the magnetic orientation of the magnetic free layer can be switched from a first direction to a second direction that is 180 degrees from the first direction. This can be accomplished, for example, by applying a current through the MTJ element in a direction that is perpendicular to the planes of the layers of the MTJ element. An electrical current applied in one direction will switch the magnetization of the free layer to a first orientation, whereas switching the direction of the current such that it is applied in a second direction will switch the magnetization of the free layer to a second, opposite orientation. Once the magnetization of the free layer has been switched by the current, the state of the MTJ element can be read by reading a voltage across the MTJ element, thereby determining whether the MTJ element is in a "1" or "0" bit state. Advantageously, once the switching electrical current has been removed, the magnetic state of the free layer will remain in the switched orientation until such time as another electrical current is applied to again switch the MTJ element. Therefore, the recorded data bit is non-volatile in that it remains intact in the absence of any electrical power.

The magnetic memory elements can be arranged in an array of memory elements that are connected with word lines and bit lines. A source-line can provide read and write currents to the memory elements, with the individual memory elements being selected by the word line and bit line.

SUMMARY

The present invention provides a magnetic memory device that includes an array of magnetic memory elements arranged in rows and columns. A source-line is connected with each of the magnetic memory elements and a bit-line is also connected with each of the magnetic memory elements. Multiplexing circuitry is connected with the source-line for selecting a sub-set of the magnetic memory elements.

In addition, multiplexing can be utilized to select a subset of the bit-lines in the memory array. The multiplexing in a cross-point magnetic memory array improves speed with which data can be retrieved and processed. This advantageously allows the memory device to provide processing speeds comparable to those of digital memory DRAM, while still providing the advantageous high data retention provided by magnetic memory.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
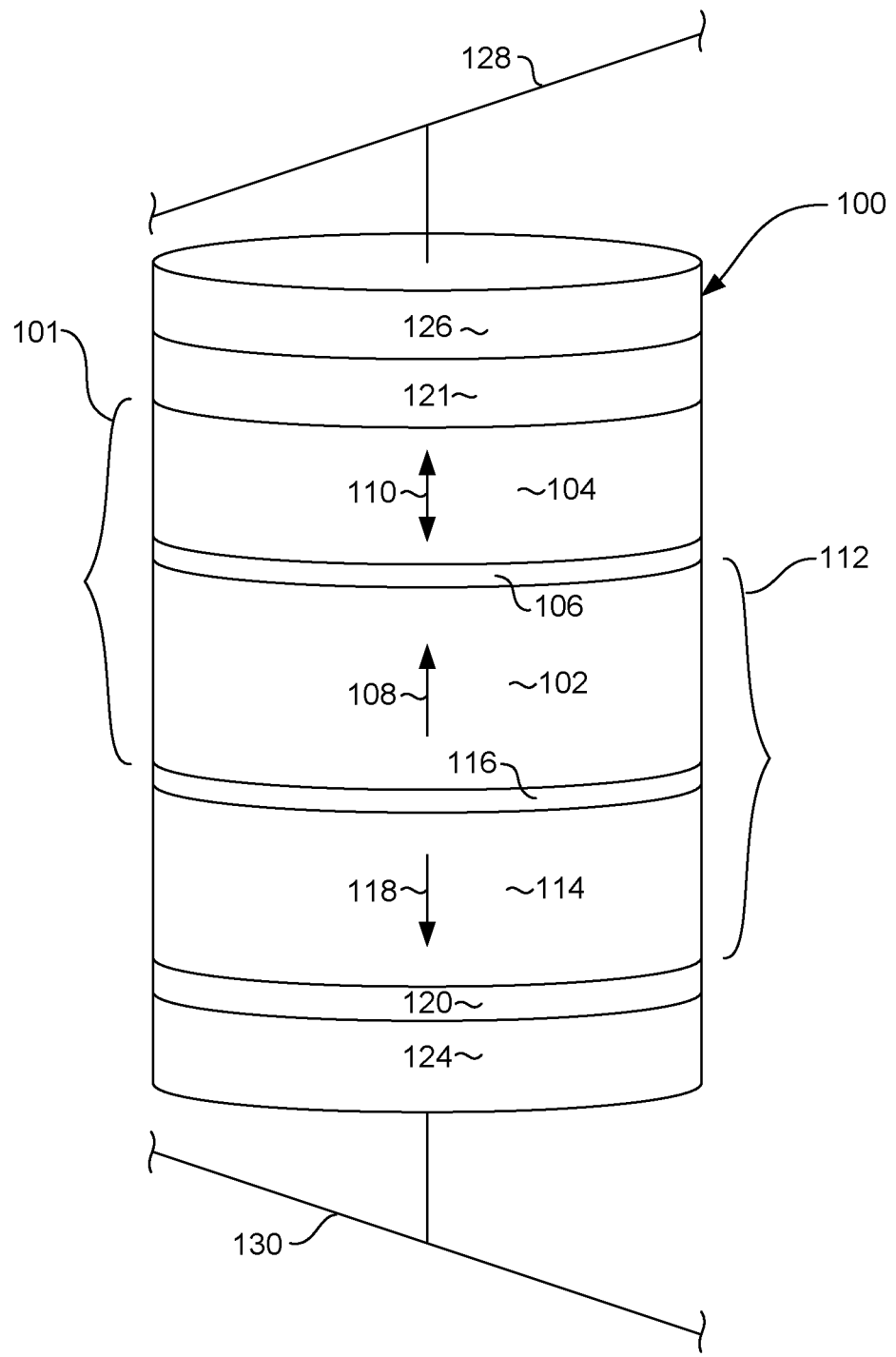
FIG. 1 is a schematic, cross sectional view of a perpendicular magnetic tunnel junction (pMTJ) element.

Referring now to FIG. 1, a magnetic memory element 100 can be in the form of a perpendicular magnetic tunnel junction (pMTJ) memory element. The magnetic memory element can include an MTJ 101 that can include a magnetic reference layer 102, a magnetic free layer 104 and a thin, non-magnetic, electrically insulating barrier layer 106 located between the magnetic reference layer 102, and magnetic free layer 104. The barrier layer 106 can be an oxide such as MgO. The magnetic reference layer has a magnetization 108 that is fixed in a direction that is preferably perpendicular to the plane of the layers as indicated by arrow 108. The magnetic free layer 104 has a magnetization 110 that can be in either of two directions perpendicular to the plane of the layer 104. While the magnetization 110 of the free layer 104 remains in either of two directions perpendicular to the plane of the layer 104 in a quiescent state, it can be moved between these two directions as will be described in greater detail herein below. When the magnetization 110 of the magnetic free layer 104 is in the same direction as the magnetization 108 of the reference layer 102, the electrical resistance across the layers 102, 106, 104 is at a low resistance state. Conversely, when the magnetization 110 of the free layer 104 is opposite to the magnetization 108 of the reference layer 102, the electrical resistance across the layers 102, 106, 104 is in a high resistance state.

The magnetic reference layer 102 can be part of an anti-parallel magnetic pinning structure such as a Synthetic Anti-Ferromagnet (SAF) 112 that can include a magnetic balancing bottom layer 114, and a non-magnetic, antiparallel coupling layer (such as Ru) 116 located between the bottom SAF layer 114 and reference layer 102. The antiparallel coupling layer 116, which will be described in greater detail herein below, can be constructed to have a composition and thickness such that it will couple the layers 114, 102 in an antiparallel configuration. The antiparallel coupling between the layers 114, 102 ensures that the magnetization 108 of the reference layer 102 is fixed in a direction opposite to the direction of magnetization 118 of the bottom SAF layer 114.

A seed layer 120 may be provided near the bottom of the memory element 100 to initiate a desired crystalline structure in the above deposited layers. A capping layer 121 may be provided near the top of the memory element 100 to protect the underlying layers during manufacture, such as during high temperature annealing and from exposure to ambient atmosphere. The capping layer 121 can be constructed of, for example, Ta.

In addition, electrodes 124, 126 may be provided at the bottom and top of the memory element 100. The electrodes 124, 126 may be constructed of a non-magnetic, electrically conductive material such as one or more of Ta, W, Cu and Al can provide electrical connection with circuitry 128 that can include a current source and can further include circuitry such as CMOS circuitry for reading an electrical resistance across the memory element 100.

The magnetic free layer 104 has a perpendicular magnetic anisotropy that causes the magnetization 110 of the free layer 104 to remain stable in one of two directions perpendicular to the plane of the free layer 104. In a write mode, the orientation of the magnetization 110 of the free layer 104 can be switched between these two directions by applying an electrical current through the memory element 100 from the circuitry 128. A current in one direction will cause the memory element to flip to a first orientation, and a current in an opposite direction will cause the magnetization to flip to a second, opposite direction. For example, if the magnetization 110 is initially oriented in a downward direction in FIG. 1, applying a current in a downward direction through the element 100 will cause electrons to flow in an opposite direction upward through the element 100. The electrons travelling through the reference layer will become spin polarized as a result of the magnetization 108 of the reference layer 102. These spin polarized electrons cause a spin torque on the magnetization 110 of the free layer 104, which causes the magnetization to flip directions.

On the other hand, if the magnetization 110 of the free layer 104 is initially in an upward direction in FIG. 1, applying an electrical current through the element 100 in an upward direction will cause electrons to flow in an opposite direction, downward through the element 100. However, because the magnetization 110 of the free layer 104 is opposite to the magnetization 108 of the reference layer 102, the electrons with an opposite spin will not be able to efficiently pass through the barrier layer 106 to the reference layer 102. As a result, the electrons having an opposite spin will be reflected at barrier layer 106, and return to the free layer 104 with a spin polarization opposite that of the reference layer 102. These spin polarized electrons cause a spin torque that causes the magnetization 110 of the free layer 104 to flip from an upward direction to a downward direction.

The magnetic memory element 100 can be electrically connected with a bit line 128 at one end and a word line 130 at the opposite end. An electrical current from the word and bit lines 128, 130 can be used to switch the memory state of the memory element 100 as described above, and can also be used to read an electrical resistance of the memory element during a read operation to determine whether the memory element 100 is in a high resistance state or a low resistance state (i.e. 0 or 1).

Figure 2:
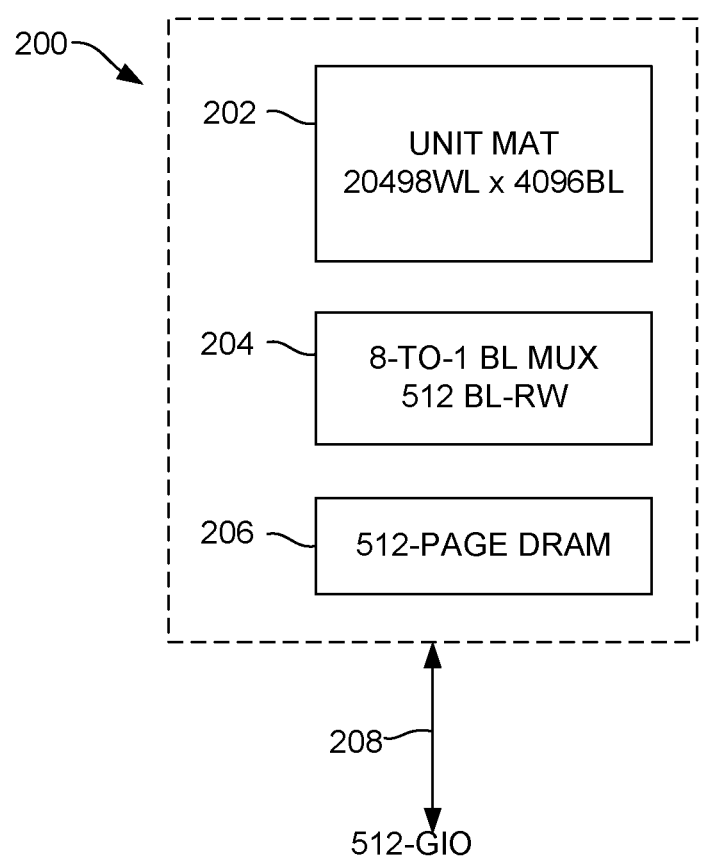
FIG. 2 Depicts a block diagram of a unit Memory Array Tile (MAT) with bit-line read/write (BL-RW) and SRAM page register, according to an illustrative embodiment.

FIG. 2 depicts a block diagram of a unit MAT with BL-RW and MRAM Page Register, according to an illustrative implementation. Memory block 200 is composed of a unit Memory Array Tile (MAT) 202, which is shown in FIG. 2 as a 2048 Word-line (2048-WL) by 4096-BL memory array. The array dimension of the unit MAT 202 may be changed or re-optimized based on process technology or product design specifications. In some embodiments, the unit MAT may include a cross-point array of magnetic memory cells such as perpendicular magnetic tunnel junction (pMTJ) or in plane magnetic tunnel junction cells. In some embodiments, the unit MAT may include the cross-point array of magnetic memory cells and additional circuitry such as sub-WL driver circuitry, BL sense amplifier circuitry, and other circuitry interspersed within a cross-point array of memory cells. In some embodiments, the unit MAT 202 may be further sub-divided into smaller memory array tiles (not shown). When further sub-divided into the smaller memory array tiles, the unit MAT may include circuitry interspersed between the smaller memory array tiles. For example, the unit MAT 202 may include bit-line multiplexor ("BL-MUX") circuitry and pre-charger circuitry. For example, the MAT 202 may include BL sense amplifier (BLSA) circuitry and page buffer circuitry. For example, the BL-MUX circuitry, pre-charger circuitry, BLSA circuitry and page buffer circuitry may be placed between the smaller memory array tiles of a subdivided unit MAT (not shown). The 4096 BL of unit MAT 202 are fed to an 8-to-1 BL MUX, such that the 4096 BLs are convened to 512 BL-RW at MUX block 204. The BL-RW may be a circuit which includes BL sensing circuitry (i.e. sense amplifier circuitry) and driver circuitry (e.g., a data-in write driver circuit). Each of the 512 BL-RW has an associated MRAM Page Register, as shown at MRAM Page Register block 206. The output of the memory block 200 is 512 General-Purpose I/O (GIO) lines shown at 208. The 512 page MRAM may be addressed by a 9 bit address. In some examples, 6 of the 9 bits may be used to decode 1 of 64 possible column select (CS) lines. In some examples, each CS line selects 8 bits, such that 64 total CS lines may access 512 bits. In some examples, the remaining bits may be used for a Double Data Rate (DDR) start burst address.

Changing any one of the BL dimensions, e.g. of the unit MAT 202 or the ratio of the BL MUX in MUX block 204, may change the total number of BL-RW in MUX block 204, number of MRAM cells in MRAM block 206 or number of output GIO lines at 208. For example, with 4096 BL in Unit MAT 202, a 4-to-1 BL MUX would result in 1024 BL-RW, MRAM Page Registers and GIO outputs at 204, 206 and 208, respectively. Any of these dimensions may be changed to adjust for product design specifications or process technology. In some embodiments, the Unit MAT size may be modified to increase the number of WL (e.g., up to or greater than 2048 WL), when a higher conductivity material is used to fabricate the BL, and thereby reduce the resistance of the BL. In some embodiments, the Unit MAT size may be modified to increase the number of BLs (e.g., up to or greater than 4096 BLs), when a higher conductivity material is used to fabricate the WL. When the number of BLs in the Unit MAT is increased, the order of the MUX in 204 may be increased to a 16-1 to MUX, and/or the number of BL-RW may be increased from 512 BL-RW to 1024 BL-RW and the size of 512-page MRAM may be increased from 512-page to 1024-page. In some embodiments, the area consumed by the MRAM page in block 206 may be reduced in exchange for a slightly larger MUX in block 204, and longer access time. Because the area consumed by the MRAM block is reduced, the amount of VLT memory cells in the Unit MAT may be increased. In order to reduce the size of the MRAM page (e.g., to 256-page) in block 206, a smaller number of BL-RW and a higher order MUX (e.g., 16-to-1 BL MUX) may be used. The reduction in the MRAM page size reduces the area occupied by the MRAM, while increasing the area of the MUX, and increases the access time of the MUX.

Figure 3:
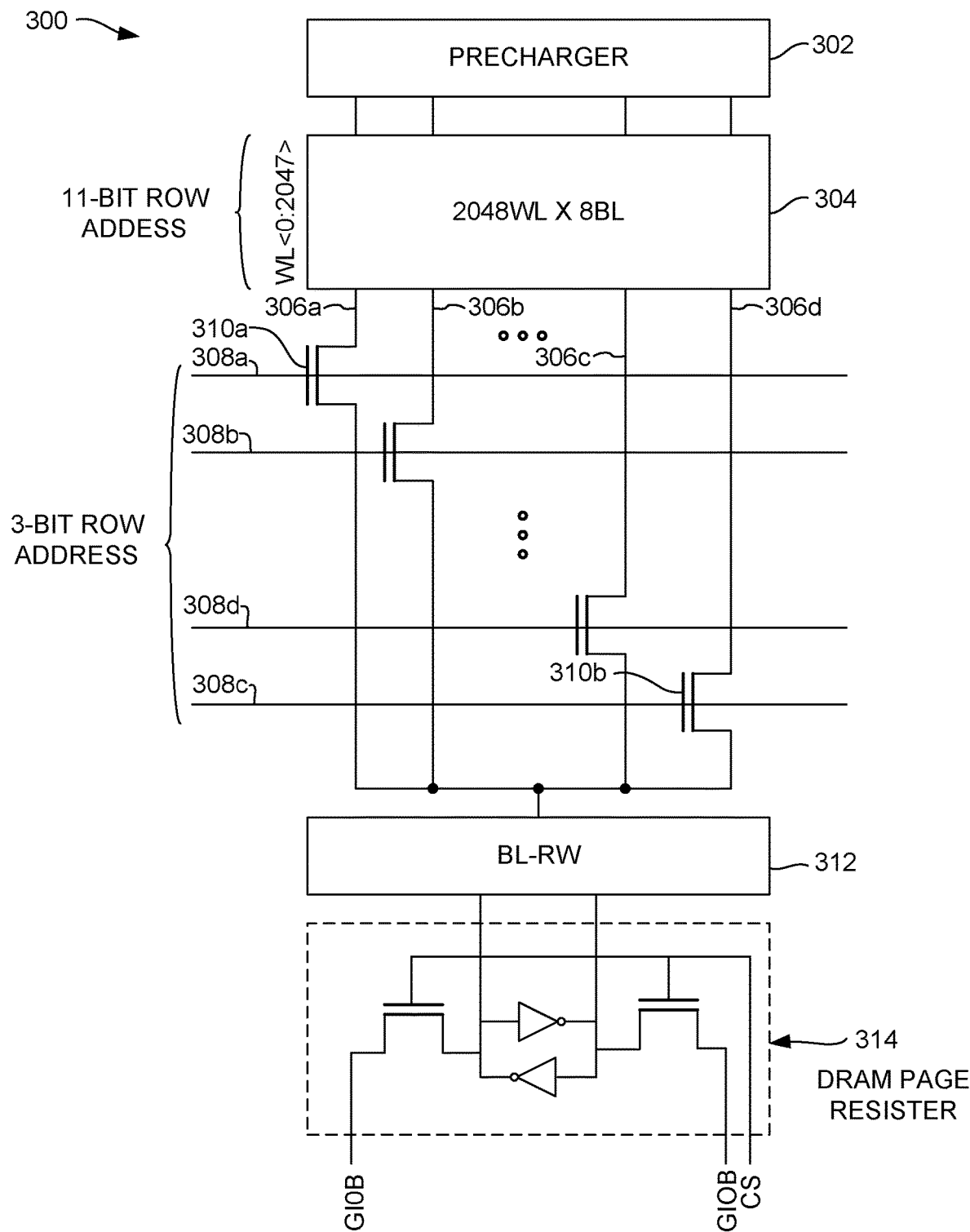
FIG. 3 depicts an 8-1 BL multiplexer (MUX) with SRAM page register, according to an embodiment.

FIG. 3 depicts a bit-line segment (BLSEG) that includes an 8-1 BL MUX and MRAM page register 314, according to an illustrative implementation. The bit-line segment 300 includes a pre-charger 302, a 2048-WL by 8-BL memory array 304, and BL columns 306 a, 306 b, 306 c and 306 d (collectively 306) each corresponding to the 8-BL of the memory array 304. The bit-line segment also includes an MRAM page register 314, and a BL-RW 312. In some embodiments, Mux Select Lines (MSLs) 308 a, 308 b, 308 c and 308 d (collectively 308), BL columns 306, and transistors (e.g., 310 a and 230 b), and a decoder (not shown, e.g., a 3-bit input to 8 line output decoder) may constitute a multiplexor (e.g., an 8-1 BL MLX, or other order of MUX). In some embodiments, the number of MSLs 308 may be the same number as the number of BL columns 306. Transistors, such as transistors 310 a and 230 b, may be located along the diagonal of the BL column 306 and MSL 308 array such that each MSL 308 is coupled via a transistor to each of the BL columns 306. WL decoding and driver circuitry (not shown) may be any standard decoder and driver circuitry. For example, a decoder that takes as input a first portion of a row address (e.g., 11 bits of a row address) may select among WLs (e.g., from among 2048 WLs of the memory array 304). Sensing and write circuitry (not shown) may be laid out within the 8-BL pitch formed by the BL columns 306 and MSL 308. This is a major advantage as it allows the layout of the pitch cells (BL sense amplifiers, write drivers, etc.) to be relaxed as well as to occupy less space.

In some embodiments, three row address bits are used to select one of the MSL 308, and, accordingly, one of the BL columns 306. Since each of the MSL 308 are coupled via a transistor (e.g., any of transistors 310 a, 310 b) to each of the BL columns 306, selecting a MSL 308 also selects a BL column 306. A selected BL column 306 is stored in MRAM Page Register 314. Thus, taking advantage of the DRAM address multiplexing scheme shown in the bit-line segment 300 allows BLs to be selected during a Row access time of a memory access cycle (e.g., DRAM access cycle). This is significant since the memory cell can be addressed ahead of the Column access time. The data in the selected magnetic memory bits can be read and stored in the MRAM during a DRAM Bank Activation time, meaning that a slower Row time may be compensated for by the faster MRAM Page Register read time (e.g., during column access time of the DRAM access cycle), allowing both MSLs 308 and columns 306 to be read within standard operating times. The row-to-column address delay is typically 15 ns to 18 ns, providing adequate time for BL sensing of the memory.

The pre-charger 302 may pre-charge all BLs 306, meaning that all BLs, such as BLs 306 a, 306 b, 306 c, 306 d, may be pre-charged before the selection from MSLs 308. The pre-charger 302 may also pre-charge the transistor corresponding to the selected MSL 308, meaning that the 3-bit row address may also be provided to the pre-charger to pre-charge one or more BLs 236 a, 306 b, 306 c, 306 d before the selected BL is stored in the MRAM Page Register 314. In some embodiments, the pre-charger 302 may be located above the 2048-WL by 8-BL memory array 304, as shown in FIG. 3. In some embodiments, the pre-charger 302 may be located below the 2048-WL by 8-BL memory array 204, such that it is located between the 2048-WL by 8-BL memory array 304 and the MSL 308. In some embodiments, the pre-charger 302 may also include BL unselect driver circuitry to drive unselected BLs to a different voltage level than the selected BL. The pre-charging of all BLs 306 may be simpler in implementation but require more power and more time to pre-charge all BLs, while the pre-charging of a subset of BLs 306 may require an additional decoder but less power and less time.

The column and memory array IO selection can be configured to accommodate a wide variety of data IO configuration and burst lengths. Today's high-speed memory can operate at clock speeds over 2.1 Ghz. In a standard double data rate interface, this gives 4.2 Gbps per pin. In order to achieve such high data rates, multiple bits may be pre-fetched in advanced to allow the on-chip serializer to output the data at the desired rate. In today's advanced memories, burst lengths of 16 bits or 32 bits are common. This means at least a 16-bit pre-fetch scheme is necessary. In a 16-n pre-fetch architecture, N 16-bit pre-fetches are needed to support an N 16-bit burst. For example, a burst operation may be understood to refer to a pre-fetch of data (e.g., 512-bits) which is sequentially accessed in smaller segments (e.g., of 16 bits, 32 bits, 64 bits, or any other suitable burst length). In some embodiments, the size of the pre-fetch data may correspond to a size of a page register (e.g., 206 in FIG. 2, 710 in FIG. 7 or another page register external to a memory block, or a memory bank). In some embodiments, the size of the pre-fetch data may be greater than or less than the size of a page register (e.g., 206 in FIG. 2, 710 in FIG. 7 or another page register external to a memory block, or a memory bank).

For example, a burst read operation may prefetch bits required for a burst read cycle. In a burst read operation where a device (e.g., a memory chip that is a component on a printed circuit board (PCB) has 16 DQs (e.g., IO pins), and a burst length is set to 16, then 16×16 bits (256 bits) are pre-fetched within the memory chip (e.g., from one or more memory blocks). For example, in a burst write operation, a sequence of group of bits (e.g., where a size of the group corresponds to a number of DQ pins on a device) may be transferred into a page register. The bits may then be written from the page register into the cross-point memory array. For example, in a 16-n prefetch architecture (as described above), a burst read operation or a burst write operation may correspond to multiple pre-fetch operations, instead of a single pre-fetch operation. Some memory configuration specifies a 16 kb (16,384 bits) page size. This means that 16 k bits are available to read or write in the high data rate described above once a page (or bank) is opened (or activated).

Figure 4:
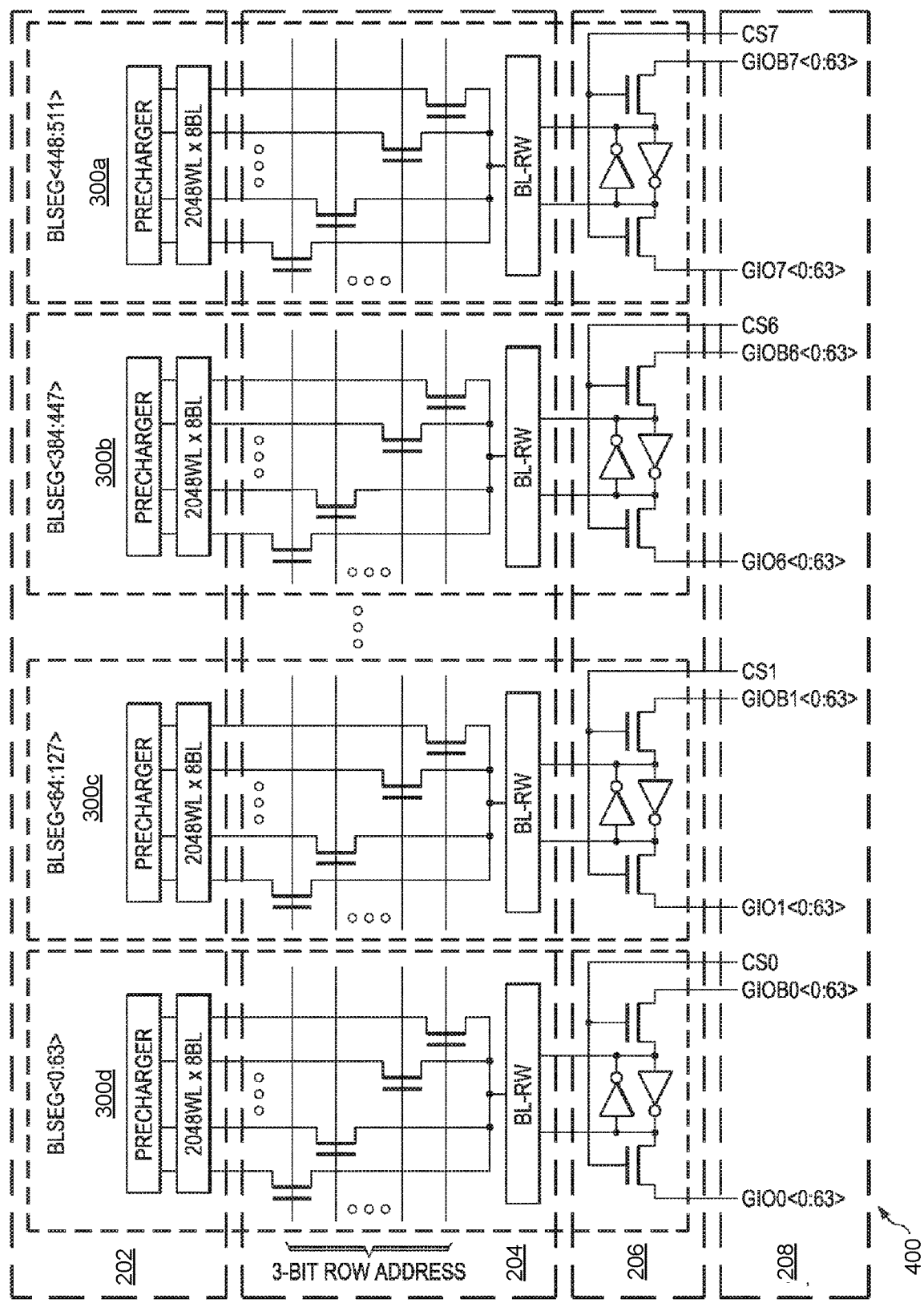
FIG. 4 depicts a single 2048×4096 or 8 Mb MAT input/output (IO) configuration, according to an embodiment.

FIG. 4 depicts a single 2048×4096 or 8 Mb MAT IO Configuration, according to an illustrative implementation. Bit-line segments, such as 300 a, 300 b, 300 c and 300 d, may form the Memory block 200 as shown in FIG. 2. A total of 512 bit-line segments may make up the 2048WL×4096 BL Memory block 200. Each column-select (CS) decoding line selects 64 bit-line segments (each with 8 bit-lines) within the 4096-BL MAT boundary. A total of 512 bits thus can be accessed. Although 512 bits may be stored in the SRAM page register, a subset of these bits may be accessed in sequence as pal of a burst operation. For example, 64 bits from each BLSEG (e.g., one of 300 a, 300 b, 300 c, 300 d), may be accessed sequentially by the CS line. For example, multiple CS may be turned on and operated simultaneously as part of a burst operation. Section 202 of the MAT IO Configuration 400 may correspond to the Unit MAT 202 of FIG. 2. Section 204 of the MAT IO Configuration 400 may correspond to the MUX block 204 of FIG. 2. Section 206 of the MAT IO Configuration 400 may correspond to the 512 Page Register DRAM 206 of FIG. 2. Section 208 of the MAT IO Configuration 400 may correspond to the 512 General-Purpose I/O (GIO) lines shown at 208 of FIG. 2. For a specific Address and IO configuration, a suitable memory block size can be designed to optimize the power, performance, and die area. Industry standard high-density memory devices typically include multiple banks of memory. Some have 8 banks while others have 16 or more banks.

Figure 5:
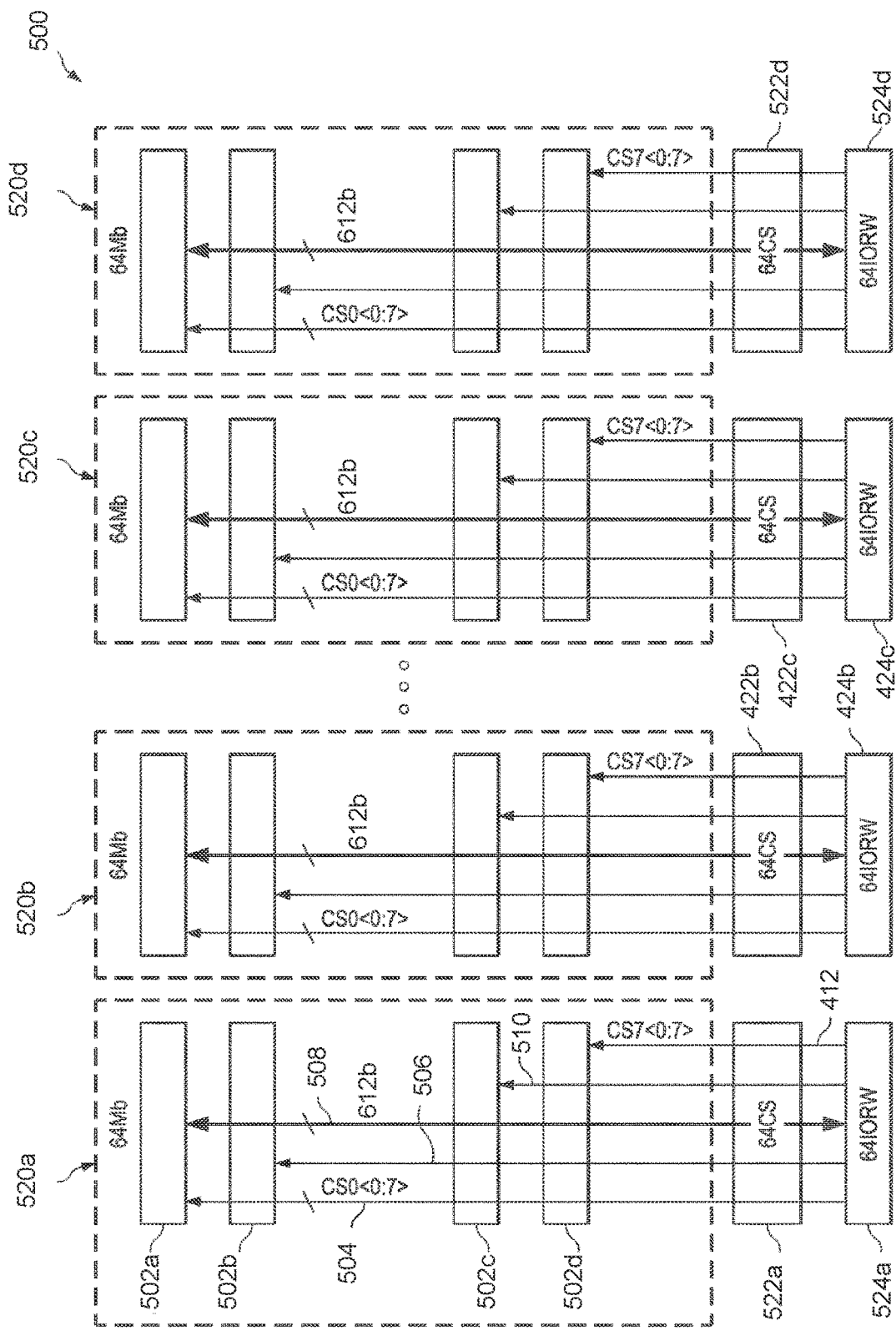
FIG. 5 depicts a block of 256 Mb Memory Banks with 2048 global IO bits, according to an embodiment.

FIG. 5 depicts a block of 256 Mb Memory Bank with 2048 Global IO Bits, according to an illustrative implementation. Memory Bank 500 may be composed of four 64 Mb segments 520 a, 520 b, 520 c and 520 d (collectively 520). Each 64 Mb segment 520 may further include eight 2048WL×4096BL (8 Mb) Memory blocks such as Memory block 502 a, 502 b, 502 c and 502 d (collectively 502) within segment 520 a. Memory blocks 502 a, 502 b, 502 c and 502 d may be the Memory block 200 as shown in FIG. 2, and thus may each contain an associated SRAM Page Register 206 with 512 differential output pairs. The 512 DRAM differential output pairs in each Memory block 502 within each segment 520 of the Memory Bank 500 are connected to a corresponding differential GIO pair (GIO0 and GIOB) as shown at 314 of FIG. 3.

In the 64 Mb segments 520, each Memory block 452 is selected by a unique set of CS lines, such as CS lines 504, 506, 510 and 512 as shown in segment 520 a. For example, CS0 <0:7> 504 selects the DRAMS in Memory block 502 a, CS1<0:7> 506 selects the DRAMS in Memory block 502 b, CS 510 selects DRAMS in Memory block 502 c, and CS7<0:7> 512 selects the DRAMS in last Memory block 502 d within segment 520 a. There are total of 64 CS lines, such as CS lines 522 a, 522 b, 522 c and 522 d, 512 GIO lines, and 512 GIOB lines within the 64 Mb segments 520 as shown in Memory Bank 500; however, these values may be adjusted to optimize for product specifications. The number of CS lines may be adjusted to access the appropriate number of bits defined by the memory configuration of any of the examples described herein. Each Memory block (e.g., blocks 502 a, 502 b, 502 c, 502 d) retrieves and stores 512 bits, as shown at 508, in their respective DRAM page registers, such as Page Register 206. Multiple Memory blocks can be turned on at the same time to access more bits. For a page size of 16 kb, 32 MATs should be selected (512×32).

In all, 512 GIO-pairs can be multiplexed to 64 Data Read/Write (DRW) or 128 DRW lines (not shown) depending on the address configuration. For example, if 15 bits are used to address the row (32 k rows, then GIO bits from each 128 Mb (two 64 Mb segments) will be multiplexed to give a maximum IO width of 1024 bits. If 14 bits are used to address the row (16 k rows), then the maximum IO width can be 2048 bits. Many high-density memory devices are configured with X8, X16, or X32 DQs. In the case of X16, the 16-n prefetch architecture requires a minimum data bus width of 256 lines (16×16). In FIG. 4, all 512 GIO differential pairs are multiplexed into 64 Read-Write circuits (IORW), such as Read-Write circuits 524 a, 524 b, 524 c and 524 d, which drive and receive data to and from the DRW lines (not shown). In some embodiments, a set of 64 BLSEGs (e.g., any of 300 a, 300 b, 300 c, 300 d) is selected from one of Memory blocks 502 a, 502 b, 502 c, and 502 d, as output to a respective read-write circuit (e.g., 524 a) in a respective segment (e.g., 520 a). The data on the DRW bus may be sent to the data re-ondering/parallel-to-serial circuits and to the output buffers (not shown). A total of 256 DRW lines can support a X16 DQ configuration.

Figure 6:
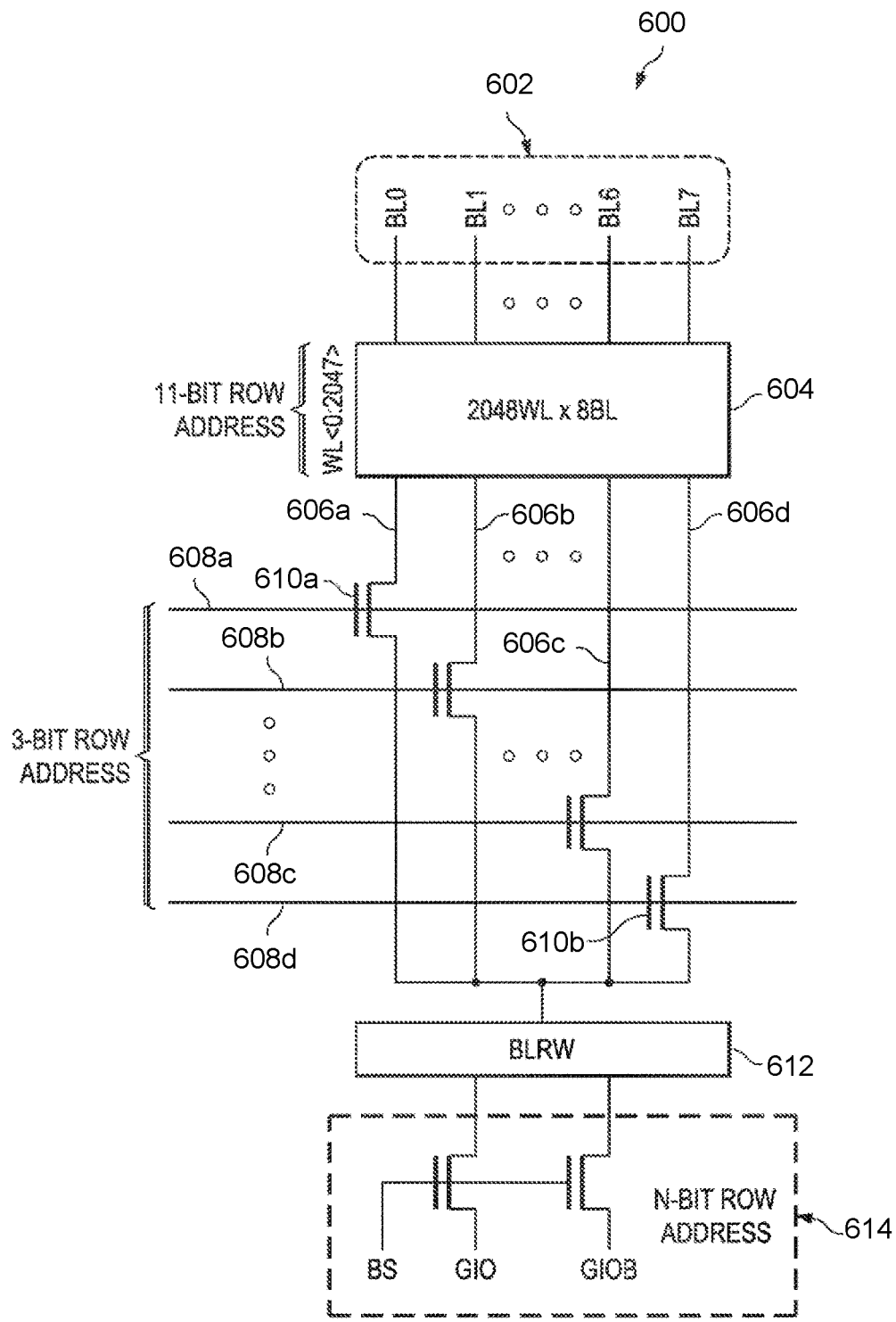
FIG. 6 depicts an alternative 8-1 BL MUX for use in memory arrays with a page resister external to the bit-line segment according to an embodiment.

FIG. 6 depicts an alternative 8-1 BL MUX for use in memory arrays with a page register external to the bit-line segment, according to an illustrative implementation. In this case, the page registers are placed outside the entire memory array instead of being coupled locally within the MAT. The bit-line segment 600 includes a 2048-WL by 8-BL memory array 604, and BL columns 606 a, 606 b, 606 c and 606 d (collectively 606) each corresponding to one of the 8-BL of the memory array 604.

MSL 608 a, 608 b, 608 c and 608 d (collectively 608) correspond to WLs, where the number of MSL 608 is the same number as the number of BL columns 606. Transistors, such as transistors 610 a and 610 b, are located along the diagonal of the BL column 606 and WL row 608 array such that each WL row 608 is coupled via a transistor to each of the BL columns 606. WL decoding and driver circuitry (not shown) may be any standard decoder and driver circuitry. Sensing and write circuitry (not shown) may be laid out within the 8-BL pitch formed by the BL columns 606 and MSL 608. This is an advantage as it allows the layout of the pitch cells (BL sense amplifiers, write drivers, etc.) to be relaxed as well as to occupy less space.

In some embodiments, three row address bits are used to select one of the MSL 608, and accordingly one of the BL columns 606. Since each of the BL columns 606 are coupled via a transistor (e.g., 610 a, 610 b) to each of the MSL 608, selecting a WL row 608 also selects a BL column 606. A selected BL column (e.g., one of columns 606) is stored externally to the bit-line segment 600 and may be output by BLRW 612. The output of BL 612 through GIO pairs 614 may be stored in an external MRAM Page Register (not shown), such as the M RAM Page Register 314 in FIG. 3, or MRAM Page register 710 of FIG. 7, discussed further below. Thus, taking advantage of the DRAM address multiplexing scheme shown in the bit-line segment 600 allows BLs to be selected at Row time. This is significant since the memory cell can be addressed ahead of the Column address time. The data in the selected memory bits can be read and stored in the MRAM during a DRAM Bank Activation time, meaning that a slower Row time may be compensated for by the faster MRAM Page Register read time, allowing both rows 608 and columns 606 to be read within standard operating times. The row-to-column address delay is typically 15 ns to 18 ns, providing adequate time for BL sensing of the memory.

Figure 7:
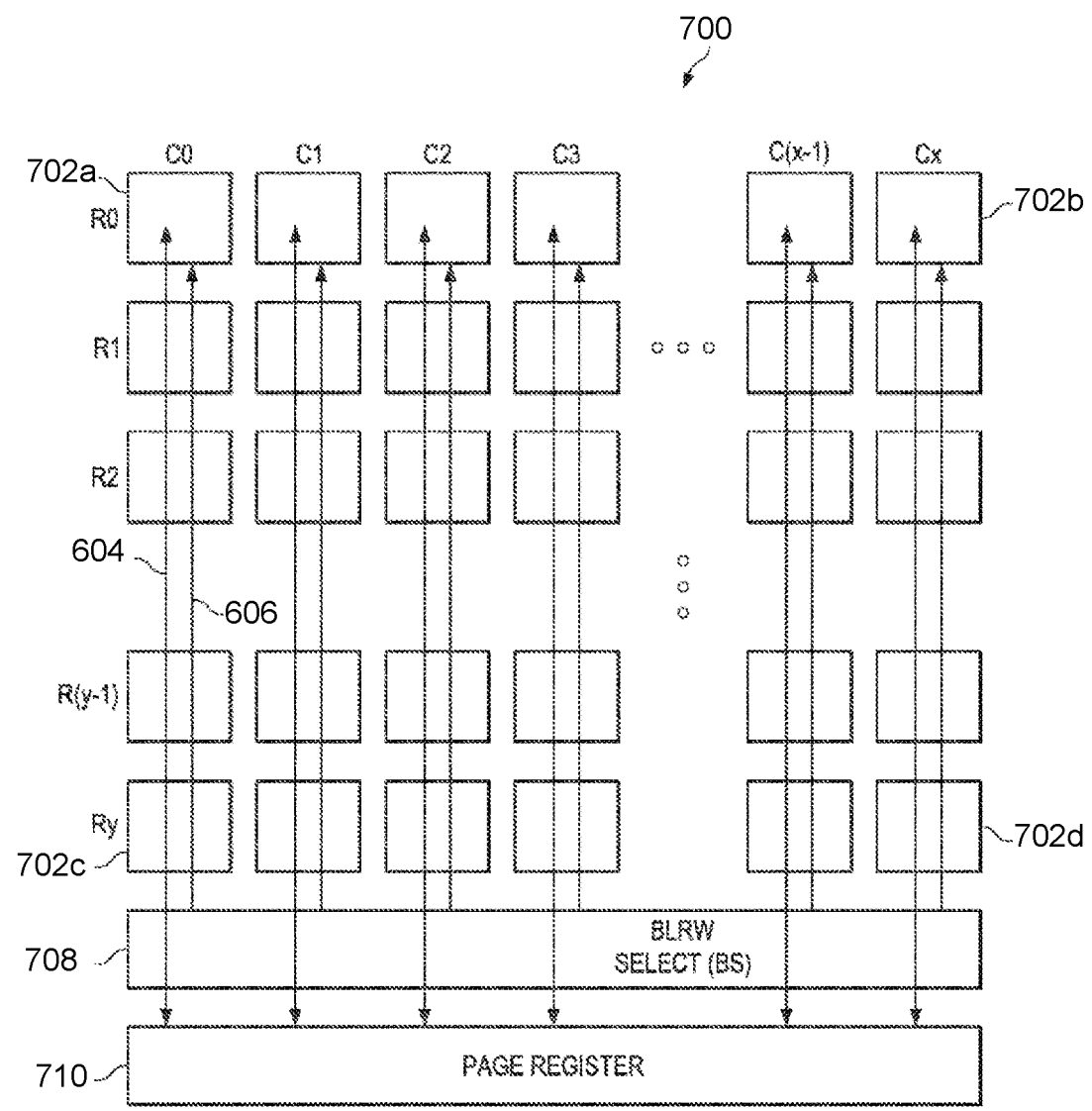
FIG. 7 depicts a block memory bank with a page resister external to the MAT, according to an embodiment.

FIG. 7 depicts a block Memory Bank with a page register external to the MAT, according to an illustrative implementation. The External Page Register Memory Bank 700 may be composed of Memory blocks, such as 702 a, 702 b, 702 c and 702 d (collectively 702). The number of Memory blocks 702, and the ratio of the dimension between Memory block 702 a and 702 b and Memory block 702 a and 702 c, may be optimized to meet both space and timing product specifications. The BLRW circuits (not shown) are selected by row address bits that generate BLRW Select (BS) at 708, while the page registers continue to be selected by CS bits and are stored at the External Page Register 710 through Page Register lines such as 704. Page Register 710 may be an MRAM Page Register, DRAM Page Register, or any other register. The output of BLRW circuits may be coupled to a pass transistor (not shown) whose gate is connected to BS 708. Each Memory block 702 has a unique BS signal line, as shown, for example, at 706. Similar to the previous architecture, the GIO differential pair lines, such as GIO lines 208 as shown in FIG. 2, connect to all column Memory blocks 702, and are each selected by a unique BS decoding signal from BS 708. The advantage of the architecture shown in the External Page Register Memory Bank 700 is that the Page Register 710 for each Memory block 702 is global instead of local, which saves area, but page size is limited by the physical arrangement of the Memory blocks 702. In FIG. 6, the BS 708 and External Page Register 710 are shown outside of the last row of Memory blocks 702; however, they may be located within the array of Memory blocks 702. The ratio of Memory blocks above and below the Page Register 710 within the array of Memory blocks 702 may be adjusted to optimize product speed and area specifications. In some embodiments, a ratio of an array size of each memory block (e.g., as measured as number of WLs and BLs in a cross-point memory array of the memory block, and/or a number of memory cells in the cross-point memory array) to an array size of an MRAM page register may vary. For example, the ratio may be 8 rows by 8 columns of (2048 WLs by 4096 BLs) (e.g., 512 M bits), to a 512-M bit SRAM page register (e.g., a 1:1 ratio). For example, the ratio may be a 2:1, 4:1, 8:1, 16:1, 32:1, 64:1 or higher ratio. As the ratio increases, there is a higher number of cross-point memory array cells to SRAM cells, and a smaller subset of the cross-point memory array cells are cached for fast access. However, as the ratio increases, efficiency of the memory bank (e.g., as measured by a percentage or fraction of device area consumed by cross-point memory array cells to a total area device area of the memory bank) increases as well.

Figure 8:
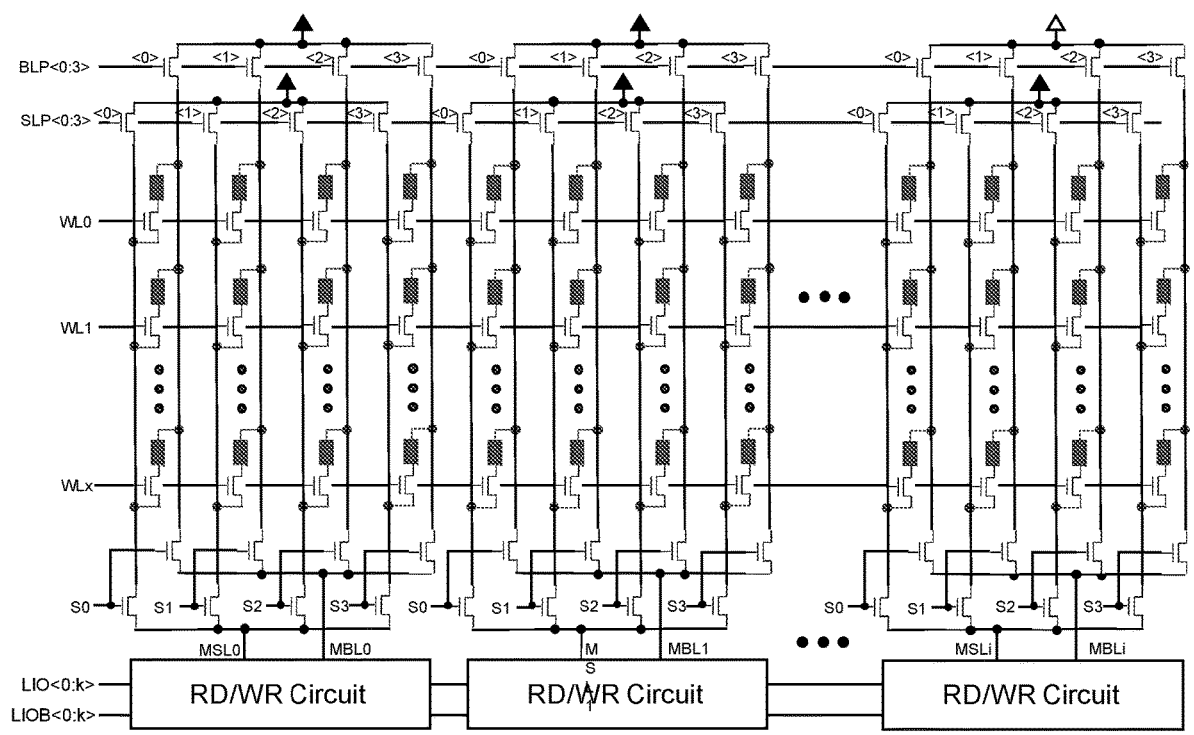
FIG. 8 is a schematic illustration of an array of memory elements.

FIG. 8 shows a schematic representation of a memory array according to an embodiment. The array 800 includes a plurality of memory banks 802a, 802b, 802c that can be referred to generally as memory banks 802. Each of the memory banks 802 includes a plurality of memory magnetic memory cells 804. The magnetic memory cells 804 can be magnetic tunnel junction elements and can be constructed as perpendicular magnetic tunnel junction elements, such as the memory element structure 100 described above with reference to FIG. 1.

Figure 9:
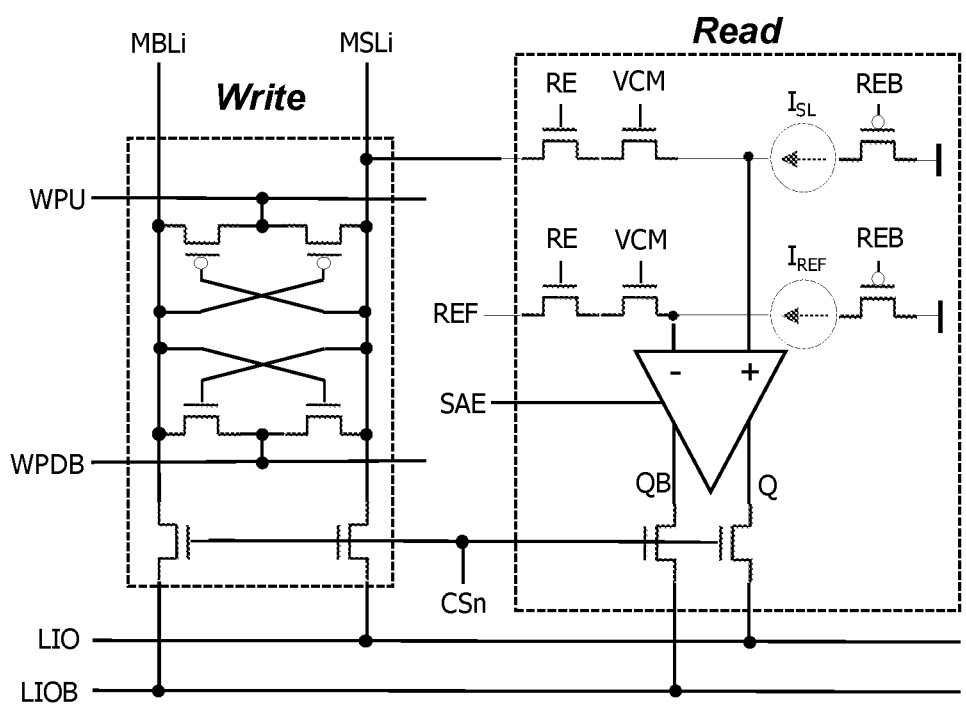
FIG. 9 is a schematic illustration of read/write input/output circuitry.

In the embodiment shown in FIG. 8, each memory bank 804 is connected with a read/write (RD/WR) circuit 806, and at an opposite end is connected with ground. An example of read/write (RD/WR) circuitry 806 is shown in FIG. 9. As shown in FIG. 9, the read/write circuitry 806 can include a read portion 904 and a write portion 902. With continued reference to FIG. 8, each magnetic memory element 804 is connected with a selector 808 to control current and voltage flow through the memory element 804. Each selector 808 can be a transistor, which can be controlled by a gate voltage from a word line WL. Each row of memory elements 804 and selectors 808 is connected with a particular common word line WL (e.g WL0, WL1, WLx) which can be a common word line shared by the entire row of memory elements 804 and associated selectors 808.

Each RW/WR circuit 806 has a pair of lines MSL and MBL connected with its associated array 802. The first line MSL provides a source line for connection with a first (e.g. bottom) end of the memory elements 804 through the selector 808. The other line MBL connects provides a bit-line connection with an opposite (e.g. top) end of each of the magnetic memory elements 804. Using the lines MSL, MBL, each RD/RW circuit 806 can provide a write current in either desired direction through the memory a memory element 804 to switch the magnetization of the memory element 804 to a desired state and thereby switch the memory element 804 to either of a low resistance or high resistance state.

Source-line selector transistors S0, S1, S2, S3 can be used to select which column of the array for applying a source line voltage or current. Similarly, bit line selector transistors B0, B1, B2, B3 shown at the top of the array can be used to select which column can receive a bit line voltage/current. The selectors B0, B1, B2, B3 are activated by a gate voltage from line BLP<0:3>. The individual selectors B0, B1, B2, B3 are selected by multiplexing with each selector being coded (e.g. <0>, <1>, <2>, <3>).

In addition, source-line multiplexing is provided at line SLP<0:3> from a multiplexor (not shown in FIG. 8). A multiplexed signal from line SLP<0:3> can be used to select one of several selectors S0, S1, S2, S3 to select a column within a data bank (802a-802c).

Figure 10:
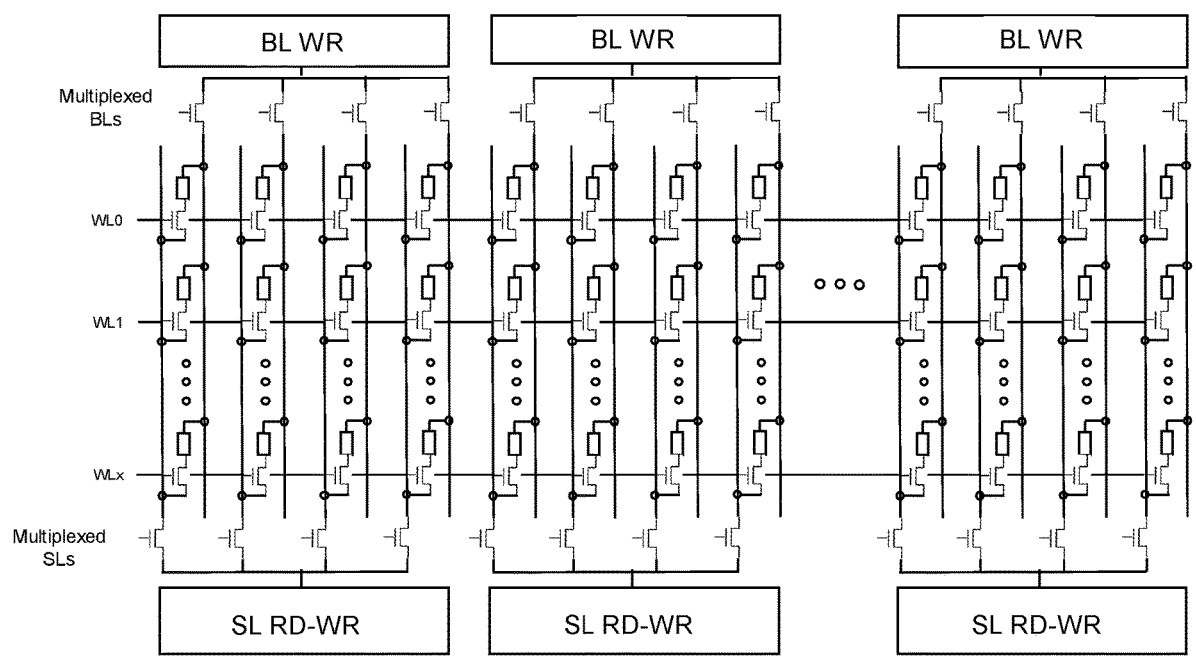
FIG. 10 is a schematic illustration of an array of memory elements according to another embodiment.

FIG. 10, illustrates a magnetic memory array 1000 according to another embodiment. The memory array 1000 includes a plurality of memory banks 1002a, 1002b, 1002c, which can be referred to generally as memory banks 1002. Each memory bank 1002 includes rows and columns of magnetic memory elements 804, which can be tunnel junction magnetic memory elements and may be perpendicular magnetic tunnel junction elements such as the memory element 100 described above with reference to FIG. 1. Each memory element 804 is connected at one end with a source-line 1004, and at an opposite end with a bit line 1006. Each memory element 804 is connected with a selector transistor 1008 to selectively control connection of the memory element with the source-line 1004. The selector transistors can be connected with a word-line 1010 which can be configured to control a row of selector transistors by applying a gate voltage to the selector transistors.

Each memory bank 1002 is connected with a source-line read/write circuit (SL RD-WR) 1012. The SL RD-WR circuitry is connected with a common source-line 1014 that connects with the columns of the associated data bank 1002. Multiplexed source-line selector transistors 1016 are provided within the common source-line to allow connection with an individual column of the data bank 1002. The source-line selectors are multiplexed with multiplexor circuitry (not shown in FIG. 10) and are coded to select an individual source-line selector transistor so that read or write current can be applied to a source-line of an individual column of memory elements.

Similarly, bit-line write circuitry (BL WR) 1016 is connected the bit lines 1006 of the memory bank 1002. The BL-WR circuitry 1016 provide a write current to the bit line to switch the memory state of the magnetic memory elements 804 of the data bank. Bit line selector transistors 1018 are provided to select which column to apply the write current to. The bit line selector transistors are multiplexed so an individual bit line selector transistor can be activated to select a desired column in the data bank 1002. Multiplexing of the bit line selector transistors is achieved through connection with multiplexor circuitry (not shown in FIG. 10) with each bit-line selector transistor 1006 being coded with a unique code (e.g. <0:3>). Multiplexing of the source-line selector transistors 1014 and bit line selector transistors 1018 increases reading and writing speed by allowing rows and columns to be quickly and easily selected in the two-dimensional array of each data bank 1002.

Figure 11:
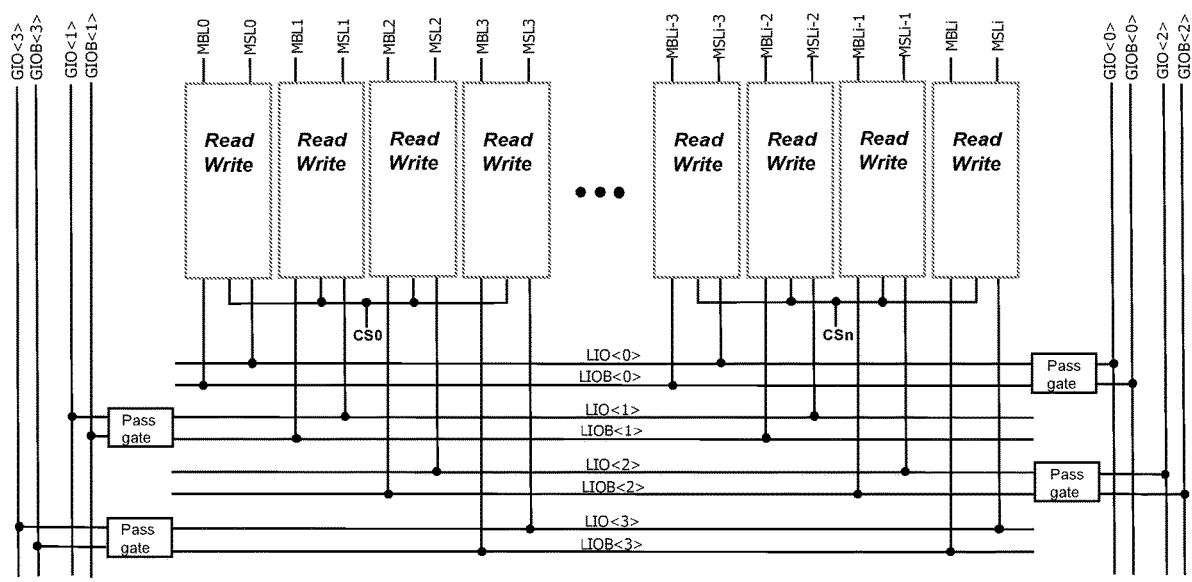
FIG. 11 is a schematic illustration of input/output (I/O) architecture for use with a data array.

FIG. 11 shows the connection of a plurality read/write circuits 1102a-1102i with input output lines of a plurality of magnetic memory data banks. As shown in FIG. 11, a selected plurality of read write circuits can be connected to a common source line CS (e.g. CS0, CSn). Each read/write circuit also includes a pair of output pairs LIO, LIOB. Connection of the various output pairs LIO, LIOB can be controlled by a plurality of Pass gates 1104.

In addition, the read write circuits 1102 can include bit line outputs MBL and source line outputs MSL. Both the bit line outputs MBL and source line outputs MSL can be multiplexed as discussed above to allow read and write current to be applied to a desired column of memory elements, as previously discussed.

Figure 12:
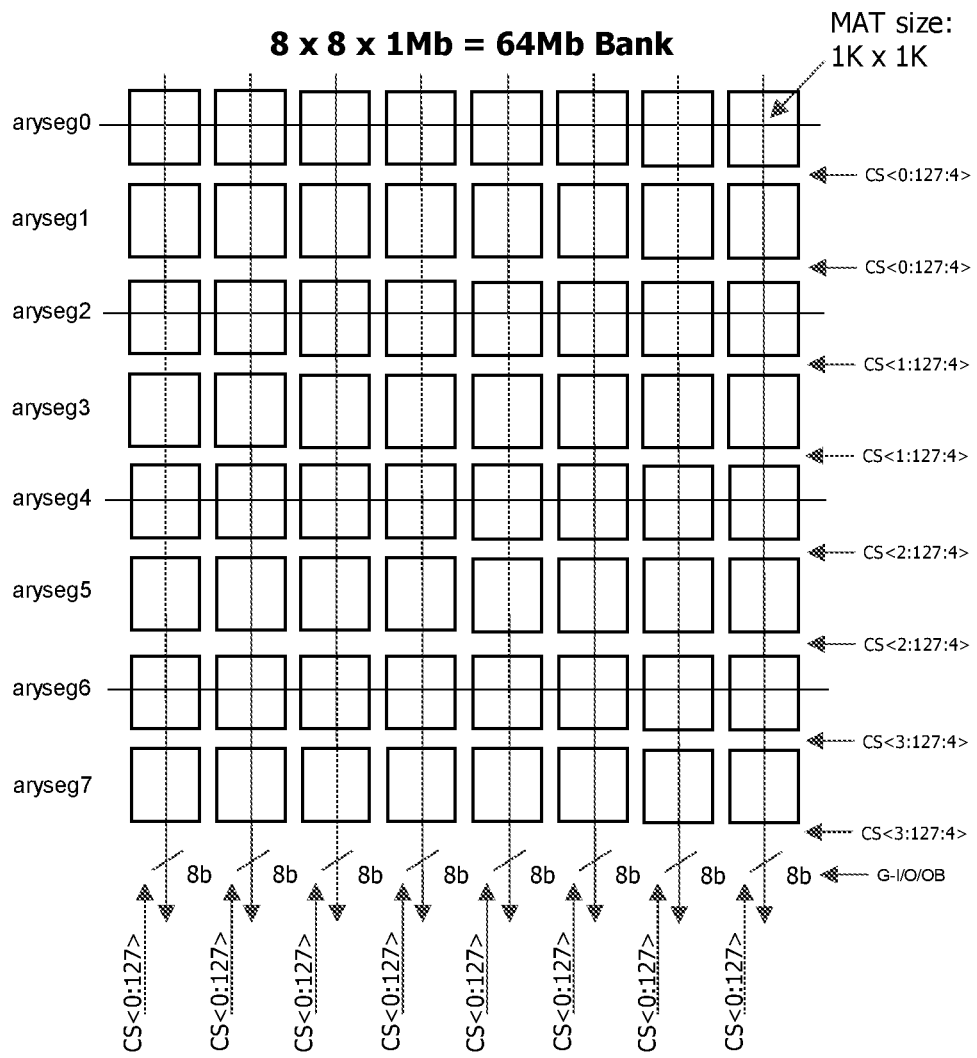
FIG. 12 is a schematic illustration of a bank of memory array tiles.

FIG. 12 shows an example of an 8×8×1 Mb band of memory array tiles 1202. Each memory array tile (MAT) can include, for example, a 1K by 1K array of memory elements, which may be configured as described above.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A magnetic memory device, comprising:
   an array of magnetic memory elements arranged in rows and columns;
   a plurality of multiplexed bit-line selector transistors that each connects with a respective bit line of a respective column of magnetic memory elements, the multiplexing allowing for a selection of an individual column of magnetic memory elements within the array by selecting a respective bit-line selector transistor connected to a corresponding column of magnetic memory elements in the array, wherein the plurality of multiplexed bit-line selector transistors selectively connect a bit line to a bit-line write circuit, and the bit-line write circuit provides a write current to the bit line selected by the respective bit-line selector transistor, the write current being applied to the bit line of the corresponding column of magnetic memory elements to switch a memory state of the corresponding column of magnetic memory elements; and
   a plurality of multiplexed source-line selector transistors that are different from the bit-line selector transistors and each source-line selector transistor connects with a respective source line of a respective column of magnetic memory elements, the multiplexing allowing selection of an individual column in the array by selecting a respective source-line selector transistor connected to a corresponding column of magnetic memory elements in the array, wherein the plurality of multiplexed source-line selector transistors selectively connect a source line to a source-line read/write circuit, and the source-line read/write circuit to apply a read current or a write current to the source line selected by the respective source-line selector transistor.

2. The magnetic memory device as in claim 1, further comprising a word line connected with the array for selecting a row of memory elements.

3. The magnetic memory device as in claim 1, wherein each of the magnetic memory elements is connected with an associated bit-line selector transistor and an associated source-line selector transistor.

4. The magnetic memory device as in claim 3, further comprising a word line configured to apply a gate voltage to at least one of the selector transistors.

5. The magnetic memory device as in claim 1, wherein each of the plurality of magnetic memory devices is a magnetic tunnel junction element.

6. The magnetic memory device as in claim 1, wherein each of the plurality of magnetic memory devices is a perpendicular magnetic tunnel junction element.

* * * * *